United States Patent [19]
Testa et al.

[11] Patent Number: 5,439,398
[45] Date of Patent: Aug. 8, 1995

[54] TRANSISTOR MOUNTING CLAMP ASSEMBLY

[75] Inventors: Martina B. Testa, Corvallis, Oreg.; Robert P. Smith, So. Plainfield, N.J.

[73] Assignee: Radio Frequency Systems, Inc., Marlboro, N.J.

[21] Appl. No.: 989,038

[22] Filed: Dec. 10, 1992

[51] Int. Cl.⁶ .............................................. H01R 4/38
[52] U.S. Cl. .................... 439/801; 411/237; 411/366
[58] Field of Search ................ 439/801, 431, 883; 411/237, 366, 187, 185

[56] References Cited

U.S. PATENT DOCUMENTS

| | | | |
|---|---|---|---|
| 1,874,593 | 8/1932 | Olson | 439/883 |
| 3,041,574 | 6/1962 | Cornell, Jr. | 439/801 |
| 3,494,399 | 2/1970 | Heighberger | 411/237 |
| 3,966,296 | 6/1976 | Ericson | 439/801 |
| 4,295,765 | 10/1981 | Burke | 411/366 |
| 4,685,761 | 8/1987 | Locati | 439/886 |

FOREIGN PATENT DOCUMENTS

539594  9/1941  United Kingdom ................ 439/733

Primary Examiner—Gary F. Paumen
Attorney, Agent, or Firm—Ware, Fressola, Van Der Sluys & Adolphson

[57] ABSTRACT

A transistor mounting clamp assembly for ensuring reliable electrical connection of a power transistor electrical connector tab (typically the collector tab) to a metallized portion of an associated printed circuit board. The transistor mounting clamp assembly comprises a top and bottom clamp dimensioned for sandwiching therebetween the transistor tab. The clamp assembly uses a machine screw and associated Belleville washer for maintaining this urging relationship even when the components expand and contract. The bottom clamp preferably has a stepped region or other surface discontinuity for securing the connector tab thereto. The clamp assembly further comprises an extending tab which is secured to the top clamp and which has a second region for providing electrical connection to the metallized portion of the printed circuit board by soldering, or other means. The overall transistor mounting clamp is able to withstand thermal expansion and contraction associated with intermittent operation of the associated power transistor and is also able to make reliable electrical connection to associated tabs of matching network elements typically used in transistor amplifier applications associated with ultra-high frequency and microwave operations. The clamp assembly can also be used to secure electrical connector tabs of other typically high-powered devices, and thus is not limited to power transistor applications.

38 Claims, 7 Drawing Sheets

TRANSISTOR MOUNTING CLAMP ASSEMBLY

TECHNICAL FIELD

The present invention relates to transistor mounting devices, and in particular, to mounting clamp assemblies for electrically connecting transistors or other high-powered devices to other circuit elements, especially where such transistors and/or devices are used for cyclically operated high-powered applications.

BACKGROUND OF THE INVENTION

High-powered transistors used for amplifying ultra-high frequency (UHF) and microwave frequencies often have low input and/or low output impedances which necessarily require matching network components to be placed as close as possible to the transistor in order to achieve reasonable power bandwidths. Typically in order to connect a radio frequency (RF) power transistor in an actual circuit, the flange of the transistor is mechanically screwed to a heat sink while the base, emitter and collector tabs of the transistor are soldered to a printed circuit board on which the necessary matching network components are placed. Thus soldering is generally used as both the electrical and mechanical fastening technique for such transistors.

In circuit applications which do not permit the transistor to be driven continuously, such as the cyclical operation of power amplifiers used for cellular communications traffic, thermal cycling stress and associated mechanical creep can lead to early failure of solder joints, especially in high current applications having small joint cross-sections, and especially where the material connected by soldering have different co-efficients of thermal expansion. The latter condition is prevalent in situations where solder is used as the method of joining a power transistor or other high-powered device to a printed circuit board trace.

The above-referenced conditions which can lead to thermal cycling stress and mechanical creep are particularly present for solder joints between the collector output tab of high power RF transistors, especially those that use nickel steel (known as Alloy 42) for the output tab, and an associated circuit board trace and the tabs of the closely spaced matching capacitors. Typical lifetimes of such solder joints when cycled at full RF power are from two to four months in cellular communication applications, and somewhat longer if power output is reduced. Identical amplifiers using the same transistors but operating on a continuous basis do not exhibit such solder joint failures. Unfortunately, in many applications, including such cellular communication signal channel amplifiers, energy costs are significant and as a result, the amplifiers are operated on a cyclical need basis dependent on the voice traffic.

A prior art fastening technique which can withstand the thermal cycle stresses and mechanical creep associated with intermittent high power use is known as brazing. This process uses high melting temperature materials, such as silver alloys, for connecting two electrically conductive objects which have still higher melting temperatures. This technique is commonly used in air conditioning and heating applications. However, the temperatures needed for conducting the brazing operation are typically in excess of 800 degrees F. (in excess of 426 degrees C.). These temperatures cannot be tolerated by power transistors nor by typical printed circuit boards and related components. In addition, other prior art electrical connection techniques which are commonly used in automotive and home wiring make use of mechanical fastening methods such as bare wire connected with screws, crimped connections, posts and the like. Such techniques are not satisfactory for preventing connection failures due to thermal stress and associated mechanical creep encountered in the high-powered transistor applications. They are also unsatisfactory for high frequency applications (typically above 400 MHz) since the wire used in such techniques introduce significant inductance into the overall circuit.

The present invention provides a solution for mounting such high-powered transistors by use of a transistor mounting clamp assembly.

SUMMARY OF THE INVENTION

A transistor mounting clamp assembly is described which overcomes thermal cycling stress and mechanical creep associated with solder joints used to join high-powered transistors to matching network components mounted on primed circuit boards, where such transistors and matching network components are typically used in ultra-high frequency (UHF) or microwave-type applications. The transistor mounting clamp assembly provides a reliable electrical connection between the collector output tab of a high-powered radio frequency (RF) type transistor and associated closely spaced matching network components mounted to a printed circuit board. Such components are typically used in UHF and microwave power amplifiers, including class C amplifiers. For such amplifiers the matching network components are typically mica capacitors if the capacitance is 10 pF or greater, due to their power handling capability and high quality factor (Q). All these components, as well as the circuit board, undergo thermal cycling stress associated with cyclical operation of such class C amplifiers under high-power conditions.

In a preferred embodiment of the present invention, the clamp assembly is used with a six-tab power transistor. The clamp assembly for this preferred embodiment has a hexagonal geometry which permits fastening the collector output tab of the transistor to the clamp assembly without contacting the ground tabs of the transistor. The hexagonal geometry of the clamp further provides for better position control and manufacturability of the clamp. A T-shape clamp assembly is also described in an alternative embodiment.

In order to permit secure mounting of the transistor and the associated network matching capacitors, especially where the transistor tab and capacitor tab geometries may vary, a conically shaped pressure contact area is formed by the top and bottom clamps. This cone area for either the top or bottom clamp, or both, may also be knurled or otherwise surface treated so as to have surface discontinuity (height variations) to facilitate pressure equalization associated with varying tab thicknesses. In a preferred embodiment, the upper surface of the bottom clamp has a stepped circular concave geometry which secures the tabs at the step edges. Shims may also be used to increase the effective thickness of one or more connector tabs which are significantly thinner than the thickest tab secured by the clamp assembly.

In addition, this well defined contact arrangement facilitates repeatability of assembly for the required matching network components. Since capacitance values are critically determined by the electrical paths from the capacitors to the power transistor, this repeatable assembly ensures substantially consistent electrical path lengths which greatly facilitate overall manufacture of the amplifier.

The top and bottom clamp each have a central bore, with the bore of the bottom clamp tapped. A machine screw is used to secure the top and bottom clamp together with the mounting tabs of the transistor and capacitor secured in the contact area. A wide extending tab is fastened to the top clamp by the same machine screw.

A shoulder washer is typically used to place the damp assembly onto an associated heat sink. Finally, a Belleville washer is typically used to absorb stress associated with differential expansion of dissimilar materials, while gold plating of the clamp assembly components is used to minimize corrosion and oxidation.

The transistor mounting damp assembly is attached to the circuit board by soldering the extending tab to a circuit board trace. The extending tab may alternatively be directly connected to other circuit components. The resulting configuration is found to be extremely reliable in operation regardless of the thermal cycling associated with intermediate use of the associated amplifier. A lug may also be formed on the extending tab to provide DC power to the connected components and thereby reduce cyclical heating associated with DC current flow through the power transistor.

OBJECTS OF THE INVENTION

It is therefore a principal object of the present invention to provide a transistor mounting clamp assembly for mechanically and electrically mounting a high-power transistor to a circuit board with its associated matching components, particularly for use in high-power amplifiers which are cyclically operated, thereby causing thermal stress.

A further object of the present invention is to provide a clamp assembly of the above description which is hexagonal in shape so as to allow fastening of the center collector tab of the transistor without touching the associated ground tabs.

A still further object of the present invention is to provide a clamp assembly of the above description which is able to accommodate variation exhibited by transistor and associated component tab geometries by use of a conical pressure contact area formed by top and bottom clamps forming part of the damp assembly, further wherein this contact area incorporates stepped regions for securing the mounting tab of the transistor and matching components.

Another object of the present invention is to provide a clamp assembly of the above description, wherein the stepped region of the contact area achieves repeatability of electrical path lengths so as to facilitate matching component value selection.

Another object of the present invention is to provide a clamp assembly of the above description that also uses shims to increase the effective thickness of connector tabs which are significantly thinner than the thickest tab secured by the clamp assembly.

A still further object of the present invention is to provide a clamp assembly of the above description, further having a tab forming part of the clamp for supply DC power and thereby reducing the thermal stress at the transistor tab.

A further object of the present invention is to provide a mounting clamp assembly for connecting high powered electrical devices to other devices.

Other objects of the present invention will in part be obvious and will in part appear hereinafter.

BRIEF DESCRIPTION OF THE DRAWINGS

For a fuller understanding of the nature and objects of the present invention, reference should be made to the following detailed description taken in connection with the accompanying drawings, in which.

BEST MODE FOR CARRYING OUT THE INVENTION

Figure 1:
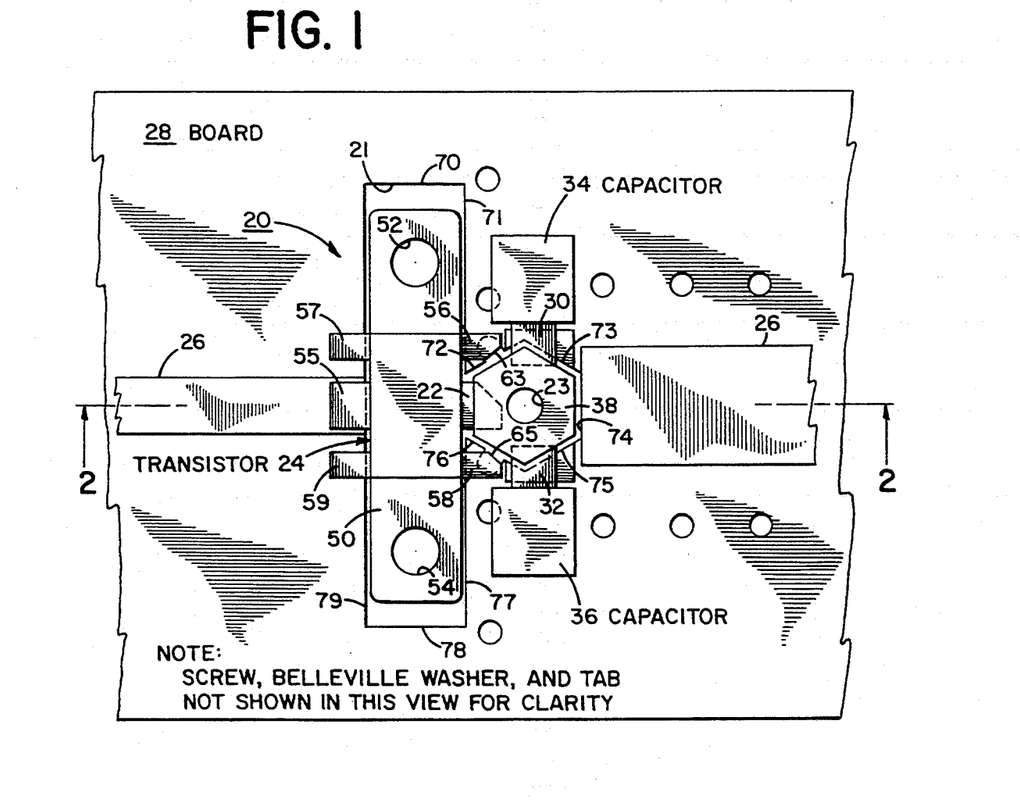
FIG. 1 is a top plan view of the transistor mounting clamp assembly according to the present invention, showing the assembly secured to a circuit board with electrical and mechanical connection to a power transistor and its associated network element capacitors. The view does not show some of the elements forming the mounting clamp assembly for purposes of clarity.
Figure 2:
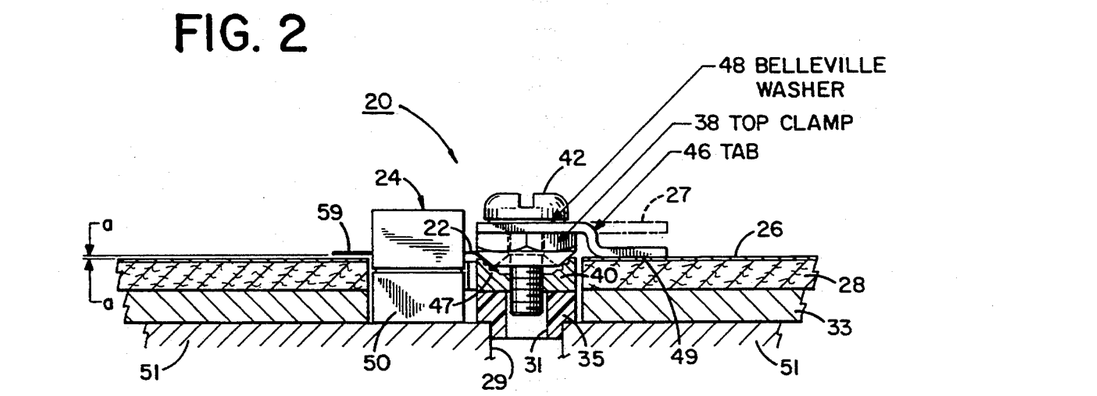
FIG. 2 is a side cross-sectional view of the transistor mounting clamp assembly with the elements not shown in FIG. 1 included in FIG. 2. This figure is generally taken along line 2—2 of FIG. 1.
Figure 5:
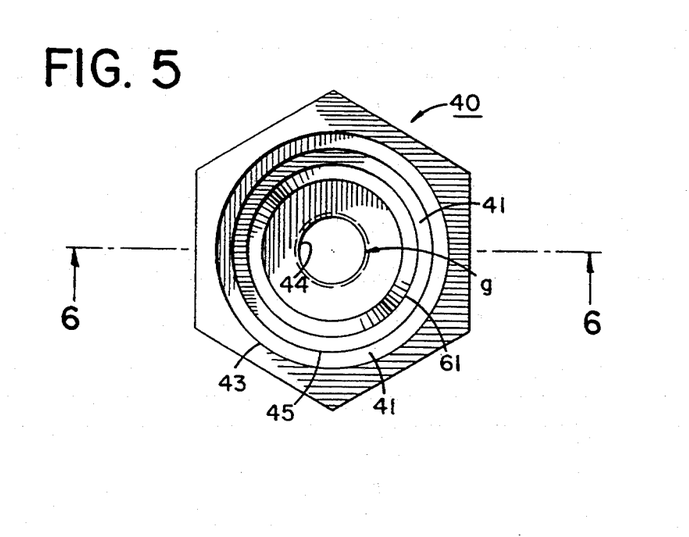
FIG. 5 is a top plan view of the bottom clamp of the transistor mounting clamp assembly.
Figure 6:
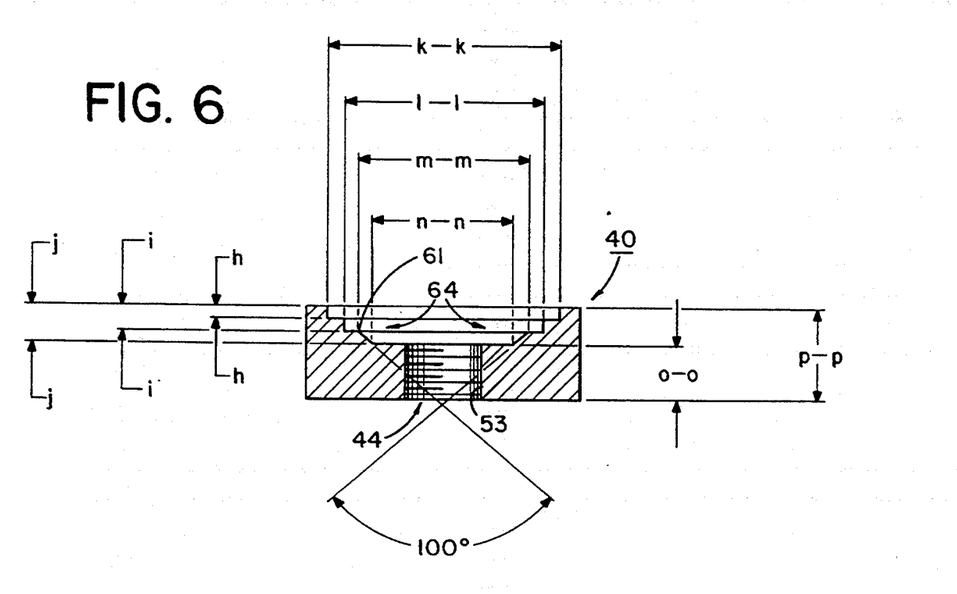
FIG. 6 is a side elevational view of the bottom clamp.

As best seen in FIGS. 1 and 2, a transistor mounting clamp assembly 20 comprises a number of constituent elements as described below which, in combination function to provide secure mechanical and electrical connection of a collector connector tab 22 of a power transistor 24 to the metallized trace 26 of printed circuit board 28. The transistor also has an emitter tab 55 and four base tabs 56, 57, 58 and 59. The mounting clamp assembly also ensures reliable mechanical and electrical connection of mounting tabs 30 and 32 of matching network capacitors 34 and 36. The constituent elements of the transistor mounting clamp assembly include a top clamp 38, a bottom clamp 40, a machine screw 42 which is threaded into threads 53 within the central orifice 44 of bottom clamp 40, an optional non-conductive shoulder washer 35, an extending tab 46, and a Belleville or lock washer 48, all as best seen in FIGS. 2, 5 and 6.

As seen in FIGS. 1 and 2, the transistor mounting clamp assembly and the associated transistor 24 are positioned over a recess 21 in printed circuit board 28 and metal shielding box 33, the recess having segments 70, 71, 72, 73, 74, 75, 76, 77, 78, and 79. Thus collector tab 22 and clamp assembly 20 only make electrical contact with circuit board 28 at region 49; that is, where extending tab 46 is soldered or otherwise connected to trace 26.

Figure 3:
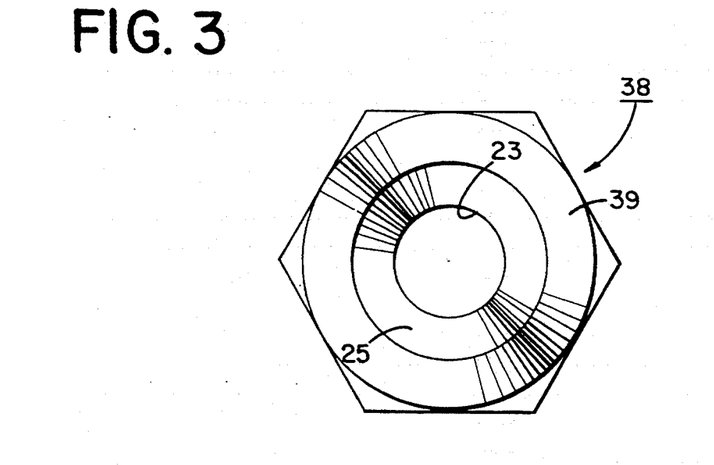
FIG. 3 is a bottom view of the top clamp of the transistor mounting clamp assembly.
Figure 4:
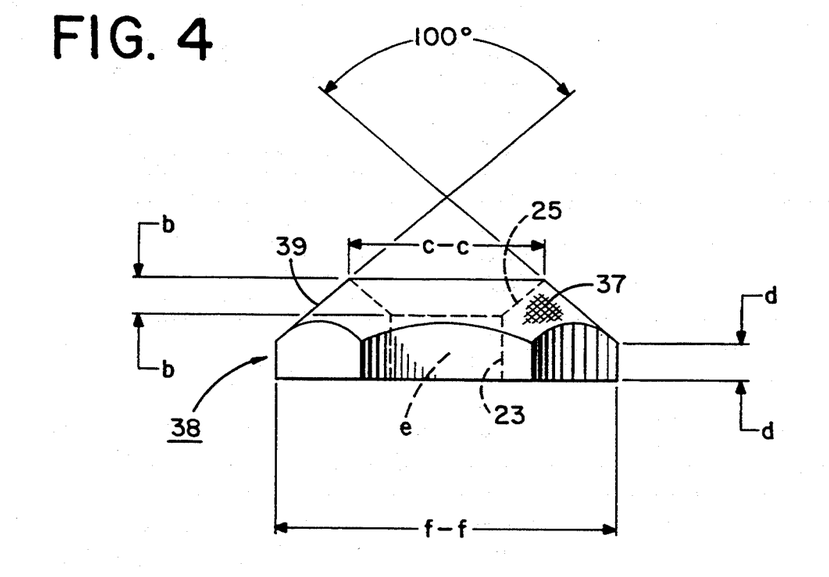
FIG. 4 is a side elevational view of the top clamp.
Figure 9:
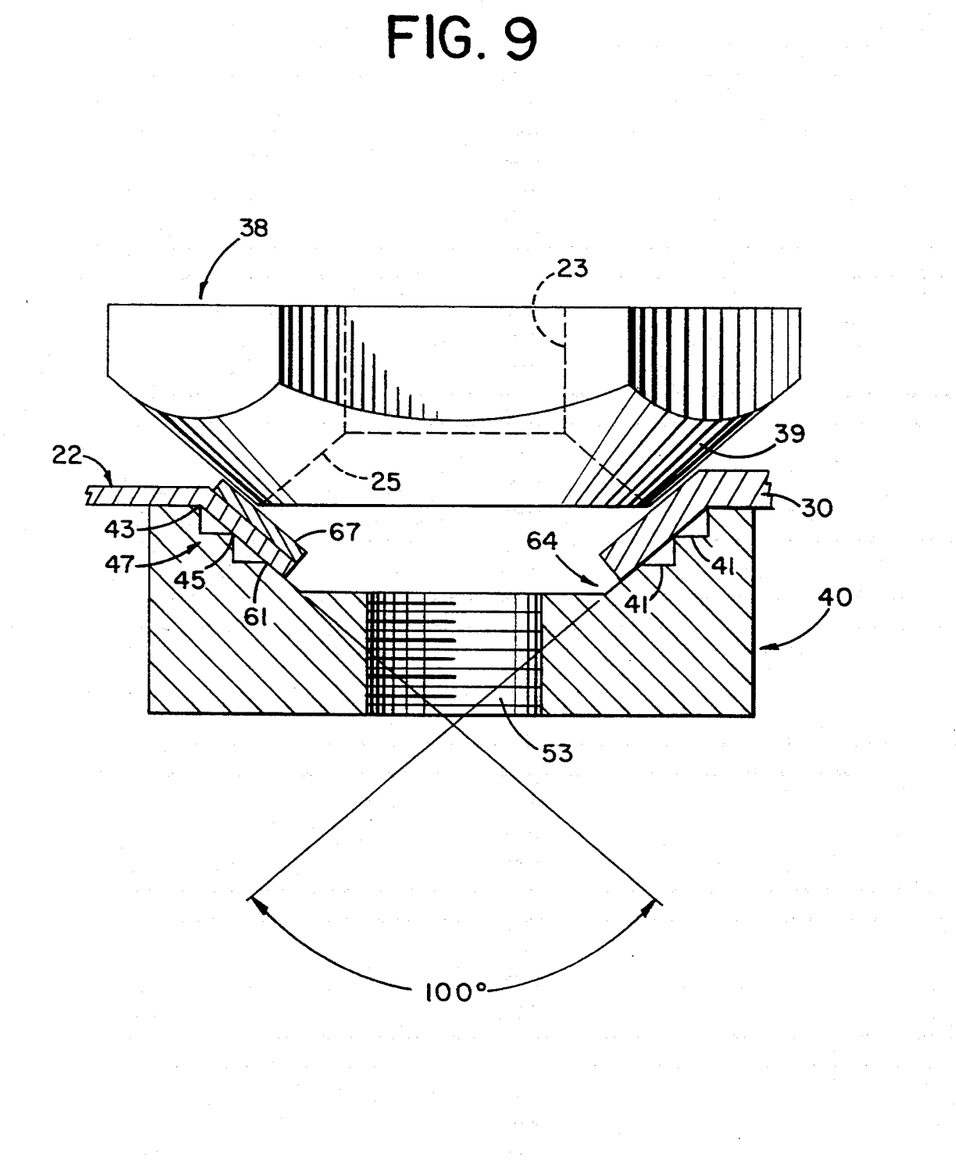
FIG. 9 is an enlarged view of the bottom clamp showing how a mounting tab is secured at the stepped regions.

The top clamp 38 as seen in FIGS. 3 and 4 includes a beveled cone-shaped surface 39 for securing engagement with transistor collector tab 22 as best seen in FIGS. 1, 2 and 9. The top clamp has a central bore which may be countersunk at region 25. In this configuration, transistor tab 22 at region 47 is mechanically secured between top clamp 38 and bottom clamp 40, as best seen in FIGS. 2 and 9. Machine screw 42 and Belleville washer 48 mechanically secure the overall mounting clamp assembly in its rigid configuration by threading the machine screw 42 into the threaded region 53 of bottom clamp 40. The machine screw may also pass into a portion of bore 31 formed within shoulder washer 35 which in turn is mounted atop a cutout 29 in heat sink 51. Washer 31, which is preferably made from Teflon ® or other non-electrically conductive material, electrically isolates clamp assembly 20 from the heat sink and thus the ground plane formed by metal box 33, while providing a secure mechanical rest for the clamp assembly.

As seen in FIG. 2, the extending tab 46 is mechanically sandwiched between the Belleville washer 48 and the upper surface of top clamp 38 so as to make intimate mechanical and electrical connection thereto and thus secure electrical connection with transistor collector tab 22. The extending tab is in turn soldered at region 49 to the metallized trace 26 of printed circuit board 28. Region 49 could alternatively be mechanically secured to trace 26 or could be directly attached to other circuit components (not shown). The extending tab may include a lug 27 (shown in phantom) for supplying DC power to the clamp assembly. By supplying DC power to the clamp assembly, overall power variation in collector tab 22 is reduced with corresponding reduction in thermal expansion/contraction.

The transistor flange 50 is internally connected to the transistor and thus forms part of transistor 24. This flange is secured to a heat sink 51 by machine screws (not shown) passing through orifices 52 and 54.

As seen in FIGS. 1, 3 and 4, top clamp 38 is preferably hexagonal in shape so as to provide mechanical and electrical engagement with the collector tab 22 of transistor 24 and the mounting tabs 30 and 32 of matching network capacitors 34 and 36, but so as not to contact the transistor base tabs 56 and 58. Base tabs 56 and 58 are shown respectively notched at regions 63 and 65 so as to provide additional clearance from the clamp assembly. The hexagonal geometry makes the clamps rotary symmetric which facilitates manufacturing since such clamps can be manufactured on a screw machine. Other rotary symmetric geometries may also be used.

It has been found that the transistor mounting clamp assembly shown in FIGS. 1 and 2 achieves reliable electrical and mechanical connection of transistor tab 22 and capacitor tabs 30 and 32 to the printed circuit board metallized trace 26. This connection is not subject to fatigue and deterioration associated with thermal cycling of the transistor during its normal operation. In particular, for power transistors used in UHF and microwave applications and especially class C amplifiers that are cyclically energized and de-energized, prior art techniques have caused solder deterioration if the collector tab 22 is soldered to the metallized trace 26. It is believed that the problem is in part due to the thermal cycling of the components and in particular, to the different thermal coefficients of expansion between the metal used to form the collector tab of the transistor and that used on the printed circuit board, as well as the solder which is used to mechanically and electrically connect those components to one another. Solder granularization can occur as a result of thermal cycling which in turn increases the resistance at the solder junction, which in turn can lead to rapid catastrophic mechanical and electrical connection failure.

The present invention by means of the top and bottom clamps which wedge the tabs between steps 41 in bottom clamp 40, mechanically and electrically secure the tabs. Surface 64 of bottom clamp 40 has sharp edges 43, 45 and 61 formed by steps 41. As seen in FIG. 9, these edges form depressions in tabs 22, 30, and 32, where the tabs contact these edges (tab 32 not shown in FIG. 9) so as to resist movement of tabs as the tabs and the associated clamps 38 and 40 expand and contract due to cycled operation of transistor 24. By so securing tabs 22, 30 and 32, the electrical paths therebetween and to solder region 49 remain relatively fixed and repeatable from installation to installation. This repeatability is maintained during cycled operation of the transistor for easier installation since the capacitance values of capacitors 34 and 36 can be set (typically 12 pF for the disclosed installation) and need not be changed during installation. The above result is not achievable through traditional soldering techniques. Other techniques for electrically and mechanically connecting components to one another which undergo thermal expansion and contraction, such as brazing, are not possible for configuring power transistors in the current configuration due to the high temperatures associated with the brazing process which would be destructive to the transistor and matching network capacitors and printed circuit board.

If any tab secured by the clamp assembly is significantly thinner than the thickest tab (such as thinner tab 22 shown in FIG. 9—note orientation of tab 30 for purposes of illustration only and does not correspond to orientation shown in FIG. 1), a shim 67 can be placed adjacent the thinner tab to increase its effective thickness to approximate the thickest tab, such as shown by shim 67 in FIG. 9. The shim is preferably made from the same material as the thinner tab to which it is placed so as to minimize differential expansion. Thus for collector tab 22, the shim is typically formed from Alloy 42.

Figure 7:
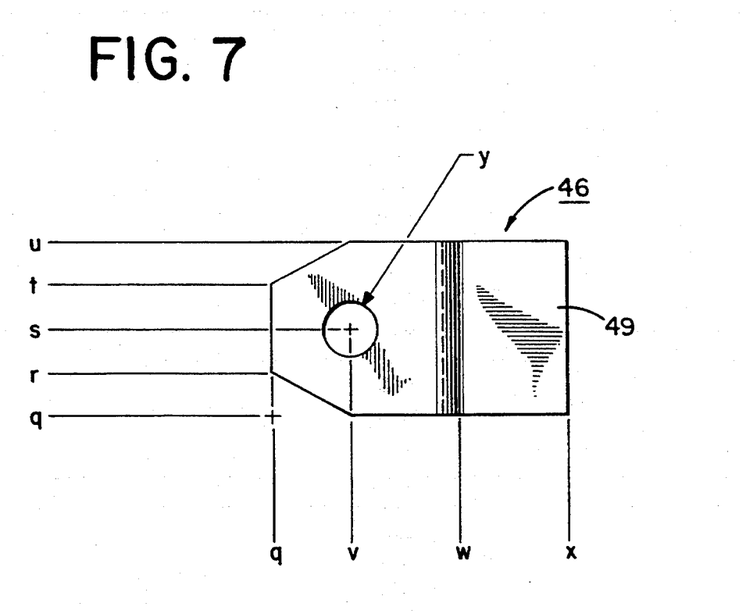
FIG. 7 is a top plan view of the extending tab forming part of the transistor mounting clamp assembly.
Figure 8:
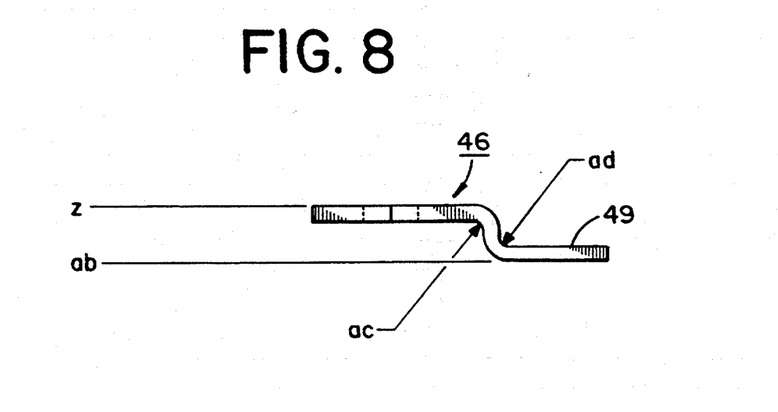
FIG. 8 is a side elevational view partially in cross-section of the extending tab.

The details of the bottom clamp are best seen in FIGS. 5 and 6 while the details of the extending tab are best seen in FIGS. 7 and 8. It should be noted that the Belleville spring washer or lock washer 48 serves as a mechanical buffer to absorb the stresses on the machine screw 42 due to differential thermal coefficient of expansion of the dissimilar metals associated with the transistor collector tab and the components of the clamp assembly and printed circuit board. Belleville washers are generally preferable to lock washers due to the former's favorable compression length versus force characteristics, thereby allowing such washers to absorb greater expansion/contraction of the clamp assembly.

It should also be noted that the relatively large area 49 of extending tab 46 improves the electrical and thermal conductivity between the extending tab and the underlaid portion of the trace. In addition, the top and bottom clamps of the clamp assembly are preferably formed from brass or similar material and provide a heat sinking function for all the connected tabs as well as the heat conductive structures associated with the extending tab 46. This heat sinking thereby reduces the stress of the extending tab solder joint to the metallized trace.

Although soldering of the extending tab 46 is used in the preferred embodiment, other means for connecting the clamp assembly to the printed circuit board trace or other component can be used. Thus the tab need not be soldered to trace 26 but could be secured thereto by mechanical means. A direct connection could also be made to another component without connection to the printed circuit board.

It should be noted that the cone-shaped portion 39 of top clamp 38 may also be knurled as shown by region 37 (FIG. 4) to help secure tabs 22, 30 and 32. Dimples, non-crossing ridges, or other surface projections can also be used to define contact areas to increase pressure against the tabs. Either or both surfaces 39 and 64 may include such surface projections. The important feature of this securing technique is that the tabs be slightly deformed at edge regions such as edges 43 for steps 41 in bottom clamp 40, so as to resist movement during thermal contraction and expansion. Clamps 38 and 40 are also gold plated (see Table 1) so as to resist corrosion and oxidation.

Although not germane to the design of the mounting clamp assembly, in the configuration shown for use in UHF applications, the geometry of the clamp assembly causes a change in the matching capacitor values for capacitors 34 and 36 from approximately 10 pF to 12 pF. This causes an approximate 12 dB reduction in the level of second harmonics at the amplifier output when the clamp assembly is used in association with a class C power amplifier, together with significantly lowered third harmonics. The various component and installation dimensions for this preferred use of the present invention are set forth in Table 1.

TABLE 1

| COMPONENT | TYPE |
|---|---|
| transistor 24 | SD1496 |
| tab 22 | alloy 42, gold plated |
| capacitors 34, 36 | mica 12 pF |
| tabs 30, 32 | silver plated |
| top clamp 38 | material: brass, hex-stock finish: gold plating 50 micro inches |
| bottom clamp 40 | material: free cutting brass ¼" hex stock finish: gold plating, 50 micro inches | dimensions (see FIGS. 2, 4, 5-8 for reference character locations)

| reference character | dimension (inch) |
|---|---|
| a-a | 0.011 |
| b-b | 0.03 |
| c-c | 5/32 dia |
| d-d | 0.030 |
| e | 0.089 dia through c'sink 5/32 dia × 82° |
| f-f | .288 |
| g | #50 drill and #2-56 UNC-2B tap through |
| h-h | 0.012 |
| i-i | 0.024 |
| j-j | 0.036 |
| k-k | 0.211 dia |
| l-l | 0.182 dia |
| m-m | 0.154 dia |
| n-n | 0.125 dia |
| o-o | 0.050 |
| p-p | 0.086 |
| qq | 0.000 datum point |

TABLE 1-continued

| r | 0.072 |
|---|---|
| s | 0.145 |
| t | 0.216 |
| u | 0.29 |
| v | 0.125 |
| w | 0.300 |
| x | 0.48 |
| y | 0.089 dia |
| z | 0.000 datum point |
| ab | 0.085 |
| ac | 0.016 max radius |
| ad | 0.016 max radius |

Figure 10:
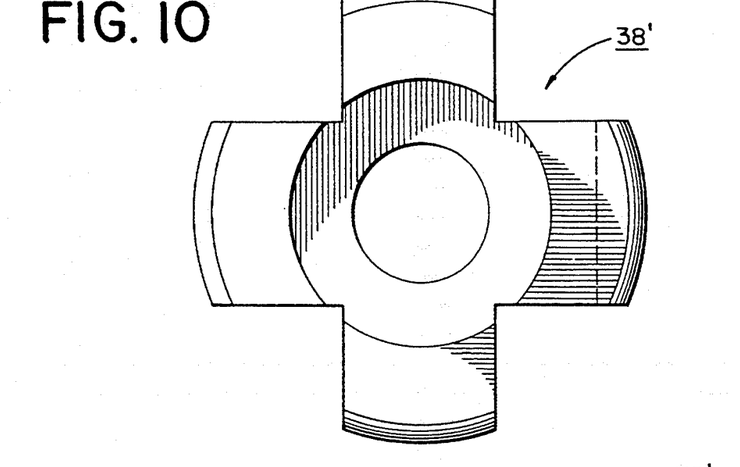
FIG. 10 is a top plan view of an alternate embodiment of the top clamp.
Figure 11:
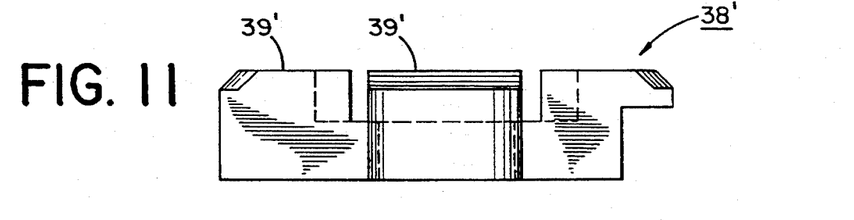
FIG. 11 is a side view of the top clamp shown in FIG. 10.
Figure 12:
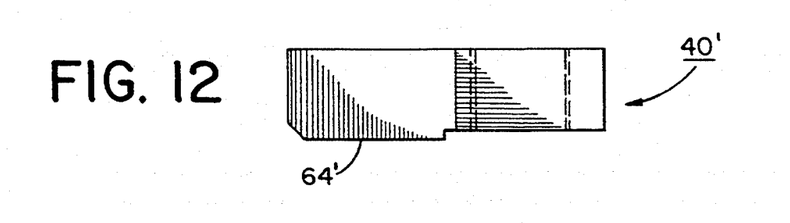
FIG. 12 is a top plan view of an alternate embodiment of the bottom clamp for use with the top clamp shown in FIGS. 10 and 11.
Figure 13:
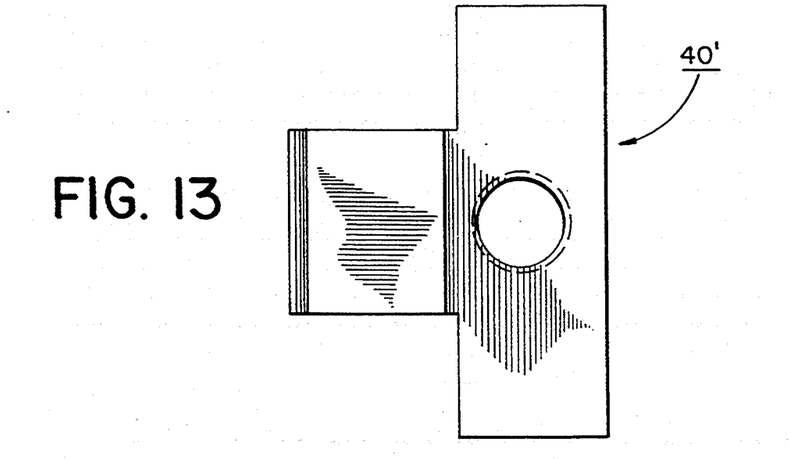
FIG. 13 is a side view of the bottom clamp shown in FIG. 12.
Figure 14:
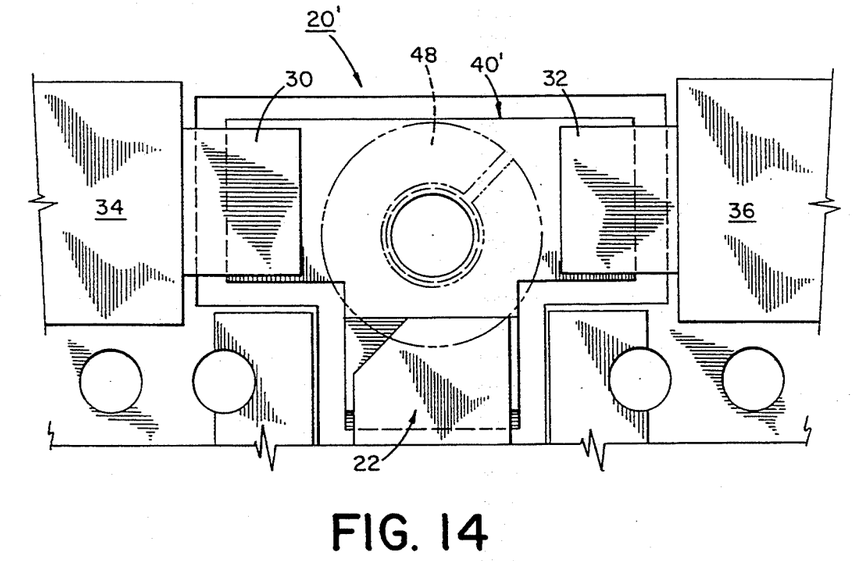
FIG. 14 is a top view of the alternate clamp assembly with the top clamp not shown, but with the lock washer shown in phantom.
Figure 15:
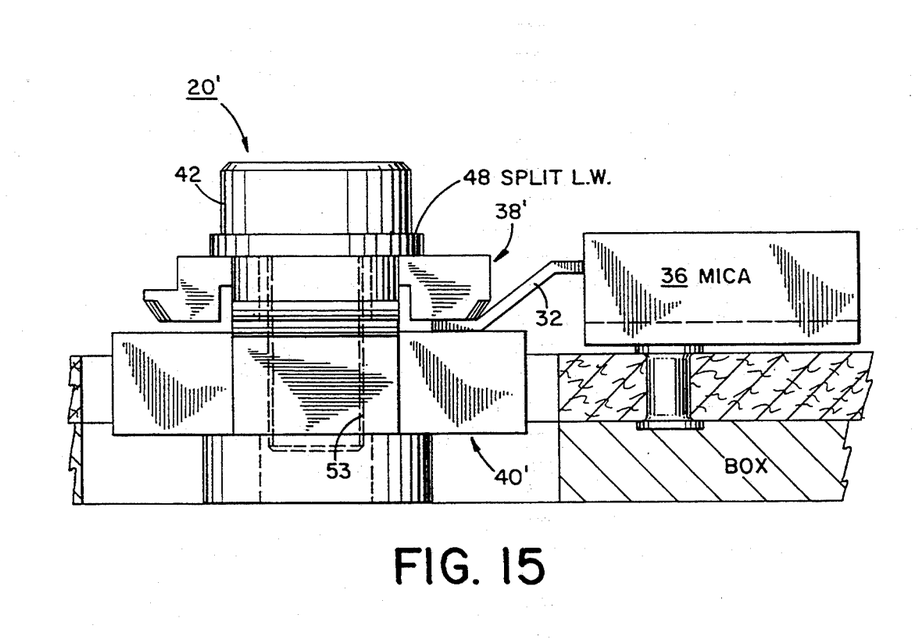
FIG. 15 is a side view of the alternate clamp assembly.

An alternative embodiment 20' of the invention is seen in FIGS. 10-15. FIGS. 10 and 11 shows that an alternative top clamp 38' can have a T-shape for securing the transistor collector tab and the main capacitor tabs therebeneath. The corresponding bottom clamp 40' as seen in FIGS. 12 and 13 is dimensioned to wedgedly secure these tabs as seen in FIG. 15. This embodiment may use planar opposed surfaces 39' and 64' for the top and bottom clamps. These surfaces may optionally be knurled or otherwise ridged or dimpled so as to create regions for securing the transistor or capacitor tabs. FIG. 14 shows the clamp assembly with top clamp 38' removed and with lock washer 48 shown in phantom.

Although the two disclosed embodiments respectively show a hex shape and T-shape configuration of the clamp assembly, other configurations of the clamp assembly top and bottom clamps are, of course, possible depending upon the placement of the tabs to be secured by the clamp assembly. In addition, although a stepped configuration of the top surface 64 of the bottom clamp has been found to be preferable for securing tabs, this configuration could be used on the opposing bottom surface 39 of the top clamp alone or with the same configuration on the top face of the bottom clamp. Other methods of generating surface discontinuities that define contact areas and increase contact pressure, such as knurling, etching, or dimpling, can also be advantageously used on these surfaces.

Thus what has been described is a transistor mounting clamp which is designed for mechanically and electrically connecting the collector tab of a power transistor so as to ensure reliable mechanical and electrical connection to a trace of a printed circuit board, even when the transistor is thermally cycled due to intermittent use of the transistor. The present invention is thereby able to drastically reduce the field failures of such power transistors when used in UHF and microwave power amplifier applications such as those associated with cellular communications.

Although the disclosed embodiments are directed for use with RF power amplifiers, the clamp assembly can also be used to reliably secure the emitter and/or base tabs of power transistors as well as any electronic component tab, especially high power components that generate relatively large amounts of heat, such as those used on electrical power loads and couplers.

It is thus seen that the objects set forth above and those made apparent from the preceding description, are efficiently attained and, since certain changes may be made in carrying out the above construction without departing from the scope of the invention, it is intended that all matter contained in the above description and drawings shall be interpreted as illustrative and not in a limiting sense.

It is also to be understood that the following claims are intended to cover all the generic and specific features of the invention herein described, and all statements of the scope of the invention which, as a matter of language, might be said to fall therebetween.

Having described the invention, what is claimed is:

1. A transistor mounting clamp assembly for electrically connecting an electrical connector tab of a power transistor to a metallized portion of an associated printed circuit board, comprising:
   A) a top clamp having a first surface dimensioned for engagement with the connector tab of the transistor;
   B) a bottom clamp having a first surface dimensioned for engagement with the top clamp first surface and with the connector tab positioned therebetween;
   C) means for mechanically urging the top clamp and bottom clamp together so as to sandwich the transistor connector tab between said first surfaces; and
   D) means for electrically connecting the clamp assembly to the metallized portion of the associated printed circuit board.

2. A transistor mounting clamp assembly as defined in claim 1, wherein the means for mechanically urging the top clamp and bottom clamp together so as to sandwich the connector tab therebetween, comprises a machine screw and a means for absorbing mechanical movement of the top clamp and bottom clamp, wherein the top clamp and bottom clamp each have a bore and wherein the machine screw passes through both bores and further wherein the bottom clamp bore is threaded for mechanical engagement by the machine screw.

3. A transistor mounting clamp assembly as defined in claim 2, wherein the means for absorbing mechanical movement of the top clamp and bottom clamp comprises a Belleville washer positioned between the machine screw and the means for electrically connecting the clamp assembly to the metallized portion of the printed circuit board.

4. A transistor mounting clamp assembly as defined in claim 2, wherein the means for absorbing mechanical movement of the top clamp and bottom clamp comprises a lock washer positioned between the machine screw and the means for electrically connecting the clamp assembly to the metallized portion of the printed circuit board.

5. A transistor mounting clamp assembly as defined in claim 3, wherein the top clamp first surface is cone-shaped for engagement with the bottom clamp, wherein the bottom clamp first surface is concavely shaped for matching engagement therewith.

6. A transistor mounting clamp assembly as defined in claim 5, wherein the bottom clamp first surface has at least one stepped region for wedging engagement with the connector tab.

7. A transistor mounting clamp assembly as defined in claim 6, wherein the top clamp and bottom clamp are each hexagonal in shape.

8. A transistor mounting clamp assembly as defined in claim 7, wherein the top clamp and bottom clamp are dimensioned for engagement with at least one additional electrical connector tab of at least one additional electronic component.

9. A transistor mounting clamp assembly as defined in claim 8, wherein the means for electrically connecting the clamp assembly to the metallized portion of the associated printed circuit board comprises an extending tab dimensioned at one region thereof for mechanical and electrical engagement with the top clamp, the extending tab having a second region dimensioned for engagement with the metallized portion of the printed circuit board for forming an electrical connection therewith.

10. A transistor mounting clamp assembly as defined in claim 9, wherein the extending tab is formed from copper and wherein the metallized portion of the printed circuit board is fabricated from copper, thereby forming a union between the extending tab and the metallized portion of the printed circuit board with similar metals so as to minimize differential thermal heating therebetween.

11. A transistor mounting clamp assembly as defined in claim 10, wherein the transistor has a metal flange forming a portion thereof, said flange dimensioned for mechanical mounting to a heat sink.

12. A transistor mounting clamp assembly as defined in claim 10, wherein the electrical connector tabs have substantially different thicknesses, and wherein the clamp assembly further comprises at least one shim for placement adjacent each electrical connector tab that has a thickness substantially less than the thickest tab, each such shim having a thickness, when combined with the thickness of the adjacent tab, that is approximately the same as the thickness of the thickest tab.

13. A transistor mounting clamp assembly as defined in claim 8, wherein the electrical connector tabs have substantially different thicknesses, and wherein the clamp assembly further comprises at least one shim for placement adjacent each electrical connector tab that has a thickness substantially less than the thickest tab, each such shim having a thickness, when combined with the thickness of the adjacent tab, that is approximately the same as the thickness of the thickest tab.

14. A transistor mounting clamp assembly as defined in claim 1, wherein the top clamp and bottom clamp are dimensioned for engagement with at least one additional electrical connector tab of at least one additional electronic component.

15. A transistor mounting clamp assembly as defined in claim 1, wherein the electrical connector tab secured by the clamp assembly is the collector tab of the power transistor.

16. A transistor mounting clamp assembly as defined in claim 1, wherein the bottom clamp has a second surface opposed from its first surface and wherein the clamp assembly is associated with a heat sink, further wherein the clamp assembly comprises a shoulder washer having a top and bottom surface, the top surface dimensioned for engagement with the second surface of the bottom clamp, and where the bottom surface is dimensioned for engagement with the heat sink.

17. A transistor mounting clamp assembly as defined in claim 16, further comprising means for receipt of DC electrical power.

18. A transistor mounting clamp assembly as defined in claim 1, further comprising means for receipt of DC electrical power.

19. A transistor mounting clamp assembly as defined in claim 1, wherein the bottom clamp first surface includes discontinuities that project toward the first surface of the top clamp.

20. A transistor mounting clamp assembly as defined in claim 1, wherein the top clamp first surface includes discontinuities that project toward the first surface of the bottom clamp.

21. A transistor mounting clamp assembly as defined in claim 1, wherein the top clamp and bottom clamp are each T-shaped and wherein three electrical connector tabs are securable between the first surface of the top clamp and bottom clamp.

22. A mounting clamp assembly for electrically connecting an electrical connector tab integrally forming part of an electrical device to another area, comprising:
A) a top clamp having a first surface in engagement with the connector tab of the electrical device;
B) a bottom clamp having a first surface in engagement with the top clamp first surface and with the connector tab positioned therebetween;
C) means mechanically urging the top clamp and bottom clamp together so as to sandwich the connector tab between said first surfaces; and
D) means for electrically connecting the clamp assembly to another area.

23. A mounting clamp assembly as defined in claim 22, wherein the means mechanically urging the top clamp and bottom clamp together so as to sandwich the connector tab therebetween, comprises a machine screw and a means for absorbing mechanical movement of the top clamp and bottom clamp, wherein the top clamp and bottom clamp each have a bore and wherein the machine screw passes through both bores and further wherein the bottom clamp bore is threaded for mechanical engagement by the machine screw.

24. A mounting clamp assembly as defined in claim 23, wherein the means for absorbing mechanical movement of the top clamp and bottom clamp comprises a Belleville washer positioned between the machine screw and the means for electrically connecting the clamp assembly to another area.

25. A mounting clamp assembly as defined in claim 24, wherein the top clamp first surface is cone-shaped for engagement with the bottom clamp, wherein the bottom clamp first surface is concavely shaped for matching engagement therewith.

26. A mounting clamp assembly as defined in claim 25, wherein the bottom clamp first surface has at least one stepped region for wedging engagement with the connector tab.

27. A mounting clamp assembly as defined in claim 22, wherein the top clamp and bottom clamp are each rotary symmetric in shape.

28. A mounting clamp assembly as defined in claim 22, wherein the top clamp and bottom clamp are in engagement with at least one additional electrical connector tab of at least one additional electronic component.

29. A mounting clamp assembly as defined in claim 28, wherein the means for electrically connecting the clamp assembly to another area comprises an extending tab dimensioned at one region thereof for mechanical and electrical engagement with the top clamp, the extending tab having a second region dimensioned for engagement with said other area.

30. A mounting clamp assembly as defined in claim 29, wherein the other area is a metallized portion of an associated printed circuit board.

31. A mounting clamp assembly as defined in claim 28, wherein the electrical connector tabs have substantially different thicknesses, and wherein the clamp assembly further comprises at least one shim for placement adjacent each electrical connector tab that has a thickness substantially less than the thickest tab, each such shim having a thickness, when combined with the thickness of the adjacent tab, that is approximately the same as the thickness of the thickest tab.

32. A mounting clamp assembly as defined in claim 31, wherein each shim is fabricated from the same material as the connector tab to which it is placed adjacent thereto, and wherein each shim is gold plated.

33. A mounting clamp assembly as defined in claim 26, wherein the top clamp and bottom clamp are in engagement with at least one additional electrical connector tab of at least one additional electronic component.

34. A mounting clamp assembly as defined in claim 22, wherein the bottom clamp has a second surface opposed from its first surface and wherein the clamp assembly is associated with a heat sink, further wherein the clamp assembly comprises a shoulder washer having a top and bottom surface, the top surface in engagement with the second surface of the bottom clamp, and where the bottom surface is in engagement with the heat sink.

35. A mounting clamp assembly as defined in claim 22, further comprising means for receipt of DC electrical power.

36. A mounting clamp assembly as defined in claim 22, wherein the bottom clamp first surface includes discontinuities that project toward the first surface of the top clamp.

37. A mounting clamp assembly as defined in claim 22, wherein the top clamp first surface includes discontinuities that project toward the first surface of the bottom clamp.

38. A mounting clamp assembly as defined in claim 22, wherein the top clamp and bottom clamp first surfaces are gold plated.

* * * * *